(12) United States Patent
Shi et al.

(10) Patent No.: US 11,693,181 B2
(45) Date of Patent: Jul. 4, 2023

(54) HIGH-DENSITY OPTICAL WAVEGUIDE STRUCTURE AND PRINTED CIRCUIT BOARD AND PREPARATION METHOD THEREOF

(71) Applicant: TTM Technologies North America, LLC, Santa Ana, CA (US)

(72) Inventors: Xinhong Shi, Shanghai (CN); Haitao Fu, Shanghai (CN); Jun Zhang, Shanghai (CN); Huamei Zhou, Shanghai (CN); Longxiu Zhu, Shanghai (CN); Marika Immonen, Turku (FI)

(73) Assignee: TTM Technologies, Inc., Santa Ana, CA (US)

( * ) Notice: Subject to any disclaimer, the term of this patent is extended or adjusted under 35 U.S.C. 154(b) by 0 days.

(21) Appl. No.: 17/053,554

(22) PCT Filed: Jul. 8, 2019

(86) PCT No.: PCT/US2019/040787
§ 371 (c)(1),
(2) Date: Nov. 6, 2020

(87) PCT Pub. No.: WO2019/222769
PCT Pub. Date: Nov. 21, 2019

(65) Prior Publication Data
US 2021/0247568 A1    Aug. 12, 2021

(30) Foreign Application Priority Data
May 8, 2018   (CN) .......................... 201810430067.7
May 8, 2018   (CN) .......................... 201820674396.1

(51) Int. Cl.
*G02B 6/122*   (2006.01)
*G02B 6/13*    (2006.01)
*H05K 1/02*    (2006.01)

(52) U.S. Cl.
CPC ............. *G02B 6/1221* (2013.01); *G02B 6/13* (2013.01); *H05K 1/0274* (2013.01); *H05K 2201/09036* (2013.01)

(58) Field of Classification Search
None
See application file for complete search history.

(56) References Cited

U.S. PATENT DOCUMENTS

2004/0033446 A1* 2/2004 Kim ..................... H05K 1/0274
                                                                    430/323
2009/0202713 A1   8/2009 Pitwon
(Continued)

FOREIGN PATENT DOCUMENTS

| WO | 2018/013122 A1 | 1/2018 | |
| WO | WO-2018013122 A1 * | 1/2018 | ............. G02B 6/122 |
| WO | 2019/222769 A2 | 11/2019 | |

OTHER PUBLICATIONS

International Search Report and Written Opinion relating to US National Application No. PCT/US2019/040787, dated Nov. 27, 2019; 7 pgs.

*Primary Examiner* — Jerry Rahll
(74) *Attorney, Agent, or Firm* — Polsinelli PC

(57) ABSTRACT

The disclosure relates to a high-density optical waveguide structure, a printed circuit board and a preparation method thereof. The high-density optical waveguide structure comprises an undercladding layer, a core layer and an upper cladding layer in sequence; wherein, the lower cladding layer is arranged at intervals. The trench is filled with an optical waveguide material to form a core layer. The waveguide structure integrates an optical waveguide into a PCB (Continued)

to realize photoelectric interconnection. The waveguide structure can better achieve higher parallel interconnection density, maintain good signal integrity, reduce device and device size, and at the same time, consume less power. The structure is configured to easily dissipate heat, enabling a simpler physical architecture and design, maximizing the wiring space of printed circuit boards, facilitating the fabrication of ultra-fine wire boards; and improving the wiring density and reliability of existing manufacturing methods.

17 Claims, 3 Drawing Sheets

(56) References Cited

U.S. PATENT DOCUMENTS

| | | | |
|---|---|---|---|
| 2010/0172620 A1* | 7/2010 | Nanai | G02B 6/13 |
| | | | 264/1.24 |
| 2012/0155822 A1* | 6/2012 | Yanagisawa | G02B 6/4214 |
| | | | 385/130 |
| 2013/0062799 A1* | 3/2013 | Jeong | G03F 7/0002 |
| | | | 264/1.24 |

* cited by examiner

HIGH-DENSITY OPTICAL WAVEGUIDE STRUCTURE AND PRINTED CIRCUIT BOARD AND PREPARATION METHOD THEREOF

CROSS REFERENCE TO RELATED APPLICATIONS

The present application claims priority to Chinese Patent Application No. CN201820674396U, entitled "High density light waveguide structure and printed circuit board," filed on May 9, 2018; and also claims priority to Chinese Patent Application No. CN201810430067, entitled "High-density optical waveguide structure, printing circuit board and preparation method thereof," filed on May 9, 2018; the entireties of each application is incorporated herein by reference.

FIELD OF DISCLOSURE

The disclosure relates to a manufacturing technology of a printed circuit board or a semiconductor integrated circuit package substrate, in particular to a high-density optical waveguide structure, a printed circuit board and a preparation method thereof.

BACKGROUND

With the development of social economy, people's demand for information has increased sharply, and the amount of information has increased exponentially. The bit rate of information that only Internet users need to transmit has increased eight times every year. In the field of long-distance wireline communications, fiber-optic communication technology can meet this high-performance requirement. However, in the field of short-distance information transmission, due to cost and technical issues, it is still dominated by electrical interconnection. However, electrical interconnections have inherent shortcomings such as electromagnetic interference, high loss and low bandwidth, which limits the further improvement of data transmission performance. As an optical signal channel, the optical waveguide has the advantages of high bandwidth, anti-electromagnetic interference, low loss, low power consumption, low crosstalk, small physical size, etc., making optical interconnection an effective solution to the high-speed electrical signal interconnection bottleneck. At the same time, the optical printed backplane technology based on optical waveguide theory is in the development stage. Its technical hotspots are the transmission characteristics of optical waveguides and the coupling of optical waveguides and optical fibers.

SUMMARY

The object of the present invention is to provide a high-density optical waveguide structure, a printed circuit board and a preparation method thereof, which can integrate an optical waveguide into a PCB to realize photoelectric interconnection; and can achieve higher parallel interconnection density better. Maintain good signal integrity and reduce device and device size.

At the same time, the power consumption is small, the heat dissipation is easy, the simpler physical structure and design can be realized, the wiring space of the printed circuit board is maximized, and the fabrication of the ultra-fine line circuit board is facilitated; and the existing preparation method can be improved. The increase in wiring density leads to improved reliability.

In order to achieve the above object, the technical solution of the present invention is:

A high-density optical waveguide structure includes a lower cladding layer, a core layer and an upper cladding layer in sequence; wherein a plurality of trenches are arranged in the lower cladding layer, and the optical waveguide material is filled in the trench to form a core layer.

Further, the inner wall of the trench in the lower cladding layer is provided with a reflective film.

Preferably, the reflective film has a thickness of 0.1 nm to 50 μm.

Preferably, the longitudinal cross-sectional shape of the groove in the lower cladding layer is circular, elliptical, triangular, trapezoidal or rectangular.

Preferably, the optical waveguide material is acrylate, polymethyl methacrylate and fluorides and oximes derived therefrom, epoxy resin, fluorine-containing polyarylene ether, fluorinated polyimide, polysiloxane, Fluorinated dendrimer or fluorinated branched polymer.

Preferably, the material of the reflective film is the same as the optical waveguide material or is a metal.

The present invention comprises the printed circuit board of the high-density optical waveguide structure, which comprises an optical waveguide structure and a first circuit layer, a dielectric layer, a second circuit layer, a solder resist layer and a surface treatment layer, respectively; Wherein, a hole filled with a conductive medium is disposed in the dielectric layer.

Preferably, the dielectric layer material is epoxy resin or polyimide.

Preferably, the surface treatment layer is chemical nickel gold, chemical silver, chemical nickel palladium gold, electroplated nickel gold, electroplated silver or electroplated nickel palladium gold.

The method for preparing a printed circuit board of a high-density optical waveguide structure according to the present invention comprises the following steps:

1) Making two or more layers of a conventional printed circuit board substrate, the substrate comprising a first conductive layer, a first insulating layer and a second conductive layer over the first conductive layer;

2) Laminating the under cladding material of the optical waveguide on the second conductive layer to be initially cured;

3) Forming a trench on the under cladding material, filling the trench optical waveguide material in the trench, and curing;

4) Forming an upper cladding layer on the optical waveguide of the lower cladding layer and the core layer, and curing;

5) Surface treatment and solder masking are performed to obtain a printed circuit board of a high-density optical waveguide.

In other embodiments, a reflective film is formed on the inner wall of the trench and filled before filling the core optical waveguide material in the trench, at step 3.

Preferably, in step 3, a reflective film is formed on the inner wall of the trench and solidified before filling the core optical waveguide material in the trench.

Preferably, step 3 is to form the trench by embossing or laser ablation.

Preferably, step 3 fills the core optical waveguide material into the trench by spin coating or implantation.

Preferably, step 3 curing the optical waveguide core layer by exposure or heating.

Preferably step 4 also includes fabricating the cladding on the optical waveguide comprises first attaching the optical waveguide material film to the optical waveguide core layer, and then obtaining the cladding on the optical waveguide by exposure and development.

Preferably, the grooves in the optical waveguide structure are prepared by imprinting.

Preferably, the embossing method comprises hot embossing, ultraviolet curing embossing, soft stencil imprinting, reverse embossing or roller embossing.

Preferably, the trenches in the optical waveguide structure are prepared by laser ablation.

Preferably, the laser ablation method comprises $CO_2$, ultraviolet light, picosecond laser, excimer, or femtosecond laser.

The Beneficial Effects of the Invention:

1. Increase Wiring Density and Save Costs

The invention adopts the processes of imprinting and laser ablation to fabricate the grooves of the optical waveguide, and can make the line width/pitch of the optical waveguide smaller, especially using the method of imprinting, the line width/interval of the optical waveguide can reach 1 μm/1 μm, greatly improving the fineness and density of optical waveguide fabrication, and its ability is much higher than the prior art process (30/30 μm).

The main reasons are as follows: The imprint technique is to emboss a nanopattern with a nano pattern on a silicon substrate coated with a polymer material by mechanical force, and the processing resolution is only related to the size of the stencil pattern, and Due to the physical limitations of the shortest exposure wavelength of optical lithography, nanoimprint technology can now produce patterns with line widths below 5 nm.

By eliminating the cost of optical lithography masks and the use of optical imaging equipment, the use of nanoimprint technology can reduce the cost of producing optical waveguides.

Not only the process stability is good, but also mass production is guaranteed.

2. Increase Bonding

In the prior art, when the optical waveguide is fabricated, the core layer is formed by exposure and development. However, in the developing process, since the optical waveguide is on the surface of the under cladding layer, it is extremely easily washed away by the developing syrup.

In the invention, when the optical waveguide is fabricated, the trench is first formed, and then the inner layer is injected into the trench or spin-coated, and the trench is already lower than the surface of the lower cladding layer, so the solution in the trench is not easy. After the solidification, the core layer is completely fixed to the inside of the lower cladding layer, and the three sides are surrounded by the lower cladding layer, and the bonding force is much larger than the prior art.

3. Low Crosstalk of Optical Signals and Low Loss

Due to the use of imprint technology and laser ablation technology to make the trench of the optical waveguide, the uniformity of the line can be greatly improved, the line is very steep, the crosstalk of the optical signal is relatively small, the loss is low, and the reliability is high.

DETAILED DESCRIPTION

Figure 1:
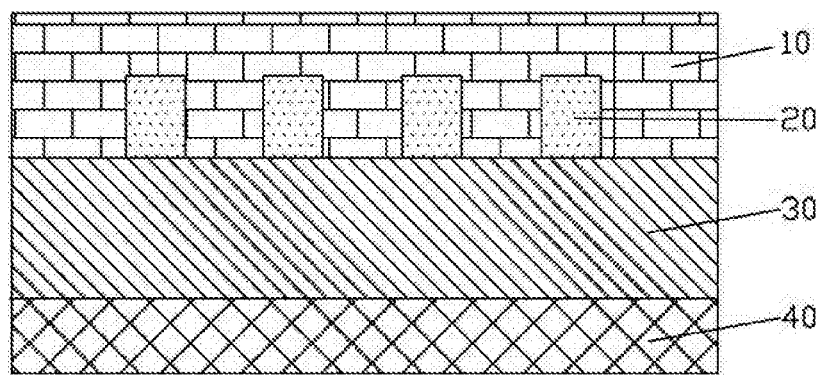
FIG. 1 is a cross-sectional view showing the structure of a conventional high-density optical waveguide structure.

At present, the conventional optical waveguide structure is as shown in FIG. 1. The optical waveguide is mainly composed of an upper cladding layer 30, a core layer 20 and an under cladding layer 10, wherein the core layer 20 is on the surface of the lower cladding layer 10, and 40 is a carrier board. The manufacturing method comprises the following steps: first forming an under cladding layer of the optical waveguide, and then placing the optical waveguide core layer material on the surface of the under cladding layer by spin coating or filming, exposing and developing, making a line, and then performing the wrapping for the production of the layers. The defect of the prior art is that in the manufacturing process, since the core layer is formed on the surface of the under cladding layer by exposure, development, etc., one side of the optical waveguide line is connected with the lower cladding layer, and the bonding force is relatively poor, during the development process. Under the attack of the syrup, the optical waveguide line is easily detached or peeled off, forming a defect, and the situation will be more serious for a relatively fine optical waveguide line.

Therefore, a new structure is required to increase the bonding force between the optical waveguide and the under cladding, and it is suitable for fabricating a relatively fine optical waveguide.

In the optical waveguide printed circuit board, the transmission characteristics of the optical waveguide play a decisive role in the performance of the system. The factors affecting the transmission characteristics of the optical waveguide are: the inherent loss of the optical waveguide material, the optical waveguide geometry, and the optical waveguide. The surface roughness of the material and the treatment of the end face, these factors will affect the transmission loss of the optical waveguide, thus affecting the stability of the system. At present, the preparation method of the optical waveguide includes reactive ion etching, ultraviolet lithography, maskless direct writing, etc. Each of the preparation methods has its own applicable range, characteristics and advantages, for example, the ion etching method is mature, and The traditional IC process is compatible, but the process is complicated, the side etching is serious, and the sidewall roughness is large; the disadvantage of the UV photolithography method is that it is difficult to control the size of the optical waveguide core layer; the maskless direct writing process is simple, and the material is directly formed. However, the equipment is expensive, the processing area is small, and mass production is difficult.

As can be seen from the above, the processing method of the optical waveguide is flexible and can be selected according to the characteristics of the material. However, the following principles need to be followed: (1) the interface roughness of the optical waveguide is small, (2) the waveguide is uniformly cured, (3) the adhesion between the waveguide and the substrate is good, no delamination, and (4) the process stability is good, and suitable for mass production.

At present, conventional optical waveguide fabrication methods are as follows:

1) Substrate Fabrication at the Bottom of the Optical Waveguide Layer

Forming a substrate at the bottom of the optical waveguide layer, the substrate comprising a first copper layer, a first substrate layer over the first copper layer, and a second copper layer over the first substrate layer;

2) Fabrication of Under Cladding of Optical Waveguide

First, the optical waveguide material film is pasted on the second copper layer of the substrate, and then the optical waveguide lower cladding layer is obtained by exposure development or exposure plus laser window opening, and the alignment region of the second copper layer for alignment is exposed;

3) Fabrication of Optical Waveguide Core Layer

First, the optical waveguide material film is pasted on the lower cladding of the optical waveguide, and then the optical waveguide core layer pattern is formed by exposure and development, and the pattern includes the core layer alignment reference pattern;

4) Fabrication of Cladding on Optical Waveguide

First, the optical waveguide material film is pasted on the optical waveguide core layer, and then the optical waveguide upper cladding layer is obtained by exposure and development;

The above method for fabricating an optical waveguide has a drawback. Due to the capability of the exposure machine, the line width/pitch of the optical waveguide produced by the above method can only reach 30/30 μm. For a finer optical waveguide fabrication, a new process must be adopted.

Figure 2:
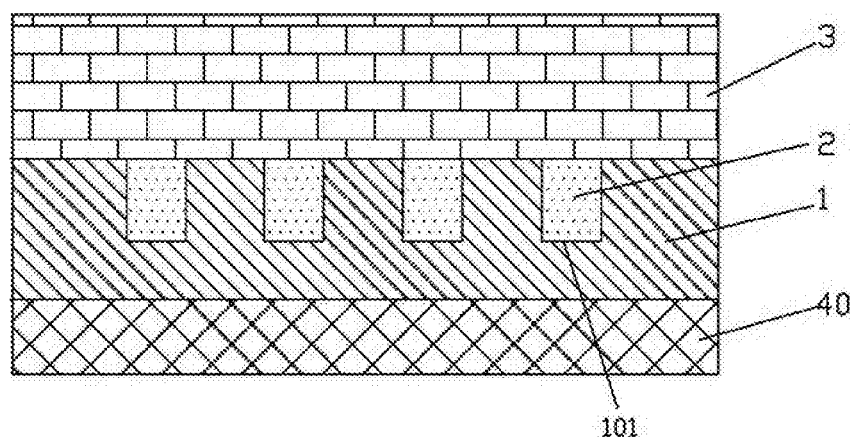
FIG. 2 is a cross-sectional view showing the structure of a first embodiment of the present disclosure.

Referring now to FIG. 2, the high-density optical waveguide structure of the present disclosure includes an under clad layer 1, a core layer 2, and an upper clad layer 3; wherein the lower clad layer 1 is internally provided with a plurality of trenches 101, and the trenches 101 The optical waveguide material is filled therein to form a core layer 2. In this embodiment, the groove 101 is rectangular.

Figure 3:
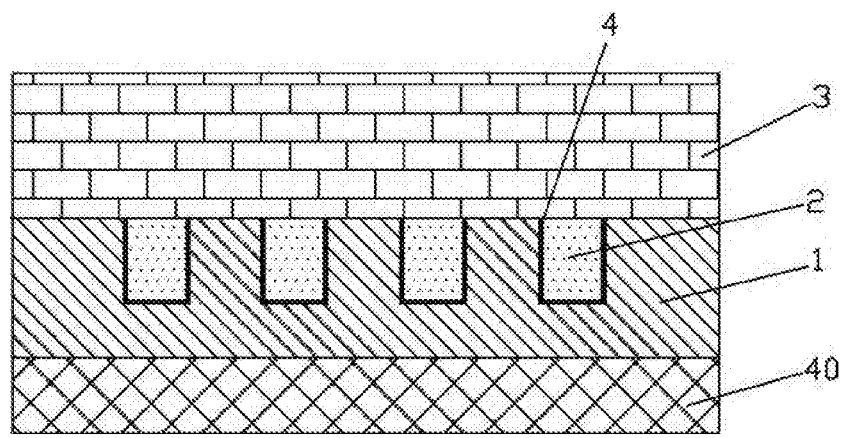
FIG. 3 is a cross-sectional view showing the structure of a second embodiment of the present disclosure.
Figure 4:
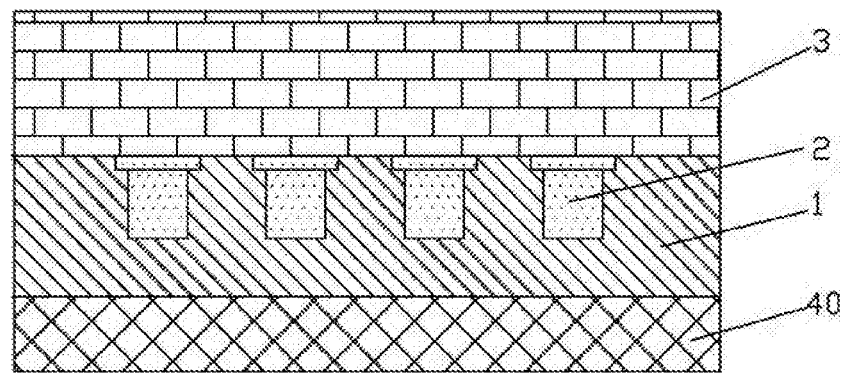
FIG. 4 is a cross-sectional view showing the structure of a third embodiment of the present disclosure.
Figure 5:
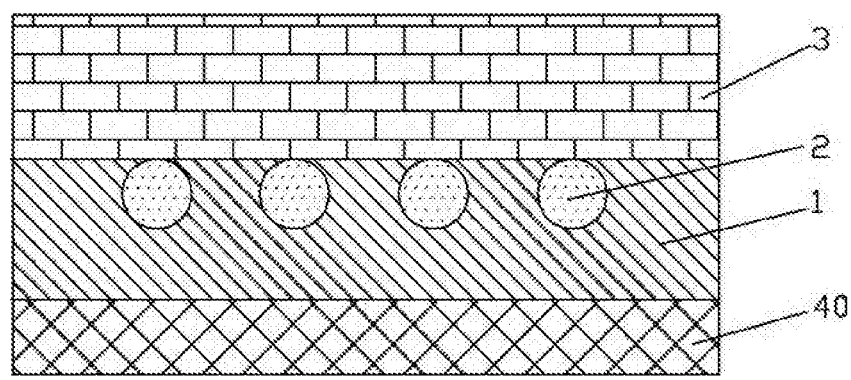
FIG. 5 is a cross-sectional view showing the structure of a fourth embodiment of the present disclosure.
Figure 6:
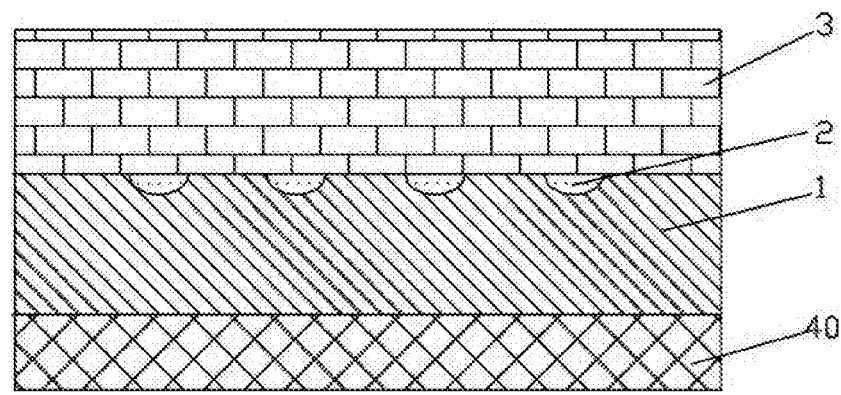
FIG. 6 is a cross-sectional view showing the structure of a fifth embodiment of the present disclosure.
Figure 7:
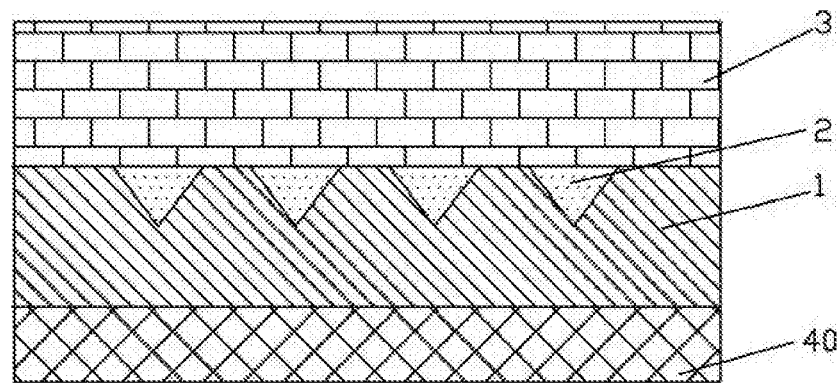
FIG. 7 is a cross-sectional view showing the structure of a sixth embodiment of the present disclosure.

Referring to FIG. 3, the inner wall of the trench 101 in the lower cladding layer 1 is provided with a reflective film 4 having a thickness of 0.1 nm to 50 μm; and the reflective film 4 is made of polysiloxane.

Referring to FIGS. 4-7, the longitudinal cross-sectional shape of the groove 101 in the lower cladding layer 1 is trapezoidal, circular, elliptical, or triangular.

Preferably, the optical waveguide material is acrylate, polymethyl methacrylate and fluoride derived therefrom, epoxy resin, fluorine-containing polyarylene ether, fluorinated polyimide, polysiloxane, fluorinated tree super/supramolecular and fluorinated branched polymers.

Figure 8:
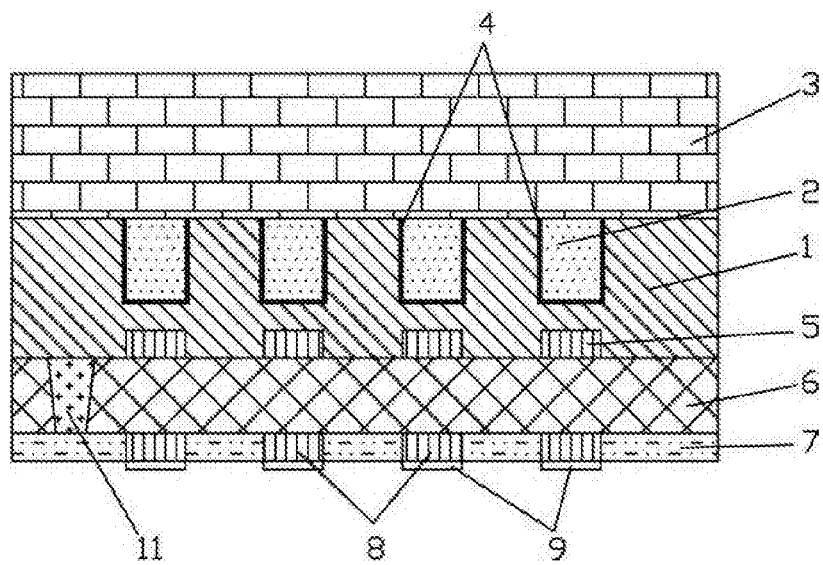
FIG. 8 is a cross-sectional view showing the structure of a printed circuit board having a high-density optical waveguide structure of the present disclosure.

Preferably, the material of the reflective film 4 is the same as the optical waveguide material, or is a metal Referring to FIG. 2 and FIG. 8, the present disclosure comprises the printed circuit board of the high-density optical waveguide structure, which comprises an optical waveguide structure and a first circuit layer 5, a dielectric layer 6, and a second circuit layer, respectively, respectively. 7. The solder resist layer 8 and the surface treatment layer 9; wherein the dielectric layer 6 is provided with a hole 11 filled with a conductive medium.

Preferably, the material of the dielectric layer 6 is epoxy resin, polyimide, polymaleimide triazine resin, polyphenylene ether or polytetrafluoroethylene, glass, quartz or silicon oxide.

Preferably, the surface treatment layer 9 is chemical nickel gold, chemical silver, chemical nickel palladium gold, electroplated nickel gold, electroplated silver or electroplated nickel palladium gold.

The invention claimed is:

1. A high-density optical waveguide structure of a printed circuit board, comprising:
a lower cladding layer comprising a plurality of trenches;
a core layer; and
an upper cladding layer over the lower cladding layer and the core layer;
wherein the printed circuit board comprises a first circuit embedded in the lower cladding layer opposite to the core layer, wherein an optical waveguide material is filled in each of the plurality of trenches to form the core layer.

2. The high-density optical waveguide structure according to claim 1, further comprising a reflective film on an inner wall of each of the plurality of trenches in the lower cladding layer.

3. The high-density optical waveguide structure according to claim 2, wherein the reflective film has a thickness ranging from 0.1 nm to 50 μm.

4. The high-density optical waveguide structure according to claim 2, wherein the material of the reflective film comprises a metal.

5. The high-density optical waveguide structure according to claim 1, wherein the optical waveguide material comprises at least one of acrylate, polymethyl methacrylate and fluoride derived therefrom, epoxy resin, fluorine-containing polyarylene ether, fluorine polyimide, polysiloxane, fluorinated dendrimer, or fluorinated branched polymer.

6. The high-density optical waveguide structure according to claim 1, wherein the longitudinal cross-sectional shape of the plurality of trenches in the lower cladding layer is one of circular, elliptical, triangular, trapezoidal, or rectangular.

7. A printed circuit board comprising the high-density optical waveguide structure according to claim 1, wherein the printed circuit board-comprises:
a dielectric layer over the first circuit layer,
a second circuit layer over the dielectric layer, the second circuit layer comprising a solder resist layer, and a surface treatment layer; wherein the dielectric layer comprises a hole filled with a conductive medium.

8. The printed circuit board with a high-density optical waveguide structure according to claim 7, wherein the dielectric layer material comprises at least one of epoxy resin, polyimide, polymaleimide triazine resin, polyphenylene ether, polytetrafluoroethylene, glass, quartz, or silica.

9. The printed circuit board with a high-density optical waveguide structure according to claim 7, wherein the surface treatment layer comprises at least one of chemical nickel-gold, chemical silver, chemical nickel palladium-gold, electroplated nickel-gold, electroplated silver, or electroplated nickel palladium-gold.

10. A method of manufacturing a printed circuit board with a high-density optical waveguide structure, comprising the steps of:

1) fabricating two or more layers of a printed circuit board substrate comprising a first conductive layer, a first insulating layer and a second conductive layer over the first conductive layer;
2) adhering a lower cladding layer of the high-density optical waveguide structure to the second conductive layer, and initially curing the lower cladding layer;
3) forming a trench in the lower cladding layer, and filling a core optical waveguide material in the trench to form an optical waveguide;
4) forming an over cladding layer on the optical waveguide and the lower cladding layer and curing the over cladding layer; and
5) performing surface treatment and solder masking to obtain the printed circuit board of the high-density optical waveguide structure.

11. The method for preparing a printed circuit board of a high-density optical waveguide structure according to claim 10, wherein the step 3) comprises forming a reflective film on the inner wall of the trench before filling the core optical waveguide material in the trench.

12. A method of fabricating a printed circuit board with a high-density optical waveguide structure according to claim 10, wherein the step 4) forming the over cladding layer on the optical waveguide comprises first attaching an optical cladding material film to the optical waveguide then hardening the over cladding layer on the optical waveguide by UV exposure and/or thermal curing.

13. A method of fabricating a printed circuit board with a high-density optical waveguide structure according to claim 10, wherein the step 3) comprises filling the core optical waveguide material into the trench by spin coating, dispensing, printing, or by deposition.

14. A method of fabricating a printed circuit board with a high-density optical waveguide structure according to claim 10, wherein the step 3) is performed by exposing or heating the optical waveguide.

15. A method of fabricating a printed circuit board of a high-density optical waveguide structure according to claim 10, wherein the step 3) is performed by embossing or laser ablation.

16. A method of manufacturing a printed circuit board with a high-density optical waveguide structure according to claim 15, wherein the embossing comprises one of hot embossing, ultraviolet curing embossing, soft stencil imprinting, reverse embossing or roller embossing.

17. A method of fabricating a printed circuit board with a high-density optical waveguide structure according to claim 15, wherein the laser ablation comprises one of $CO_2$, ultraviolet light, picosecond laser, excimer, or femtosecond laser.

* * * * *